United States Patent
Iwanishi

(10) Patent No.: US 6,629,299 B1
(45) Date of Patent: Sep. 30, 2003

(54) DELAY LIBRARY REPRESENTATION METHOD, DELAY LIBRARY GENERATION METHOD AND DELAY CALCULATION METHOD USING THE DELAY LIBRARY

(75) Inventor: Nobufusa Iwanishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 564 days.

(21) Appl. No.: 09/593,605

(22) Filed: Jun. 12, 2000

(30) Foreign Application Priority Data

Jun. 16, 1999 (JP) .......................................... 11-169229

(51) Int. Cl.$^7$ .............................................. G06F 17/50
(52) U.S. Cl. ................................ 716/6; 716/1; 703/19
(58) Field of Search ................................ 716/1, 2, 4, 5, 716/6, 18; 703/13, 14, 15, 16, 17, 19

(56) References Cited

U.S. PATENT DOCUMENTS

| | | | |
|---|---|---|---|
| 5,381,524 A | * 1/1995 | Lewis et al. | 345/804 |
| 5,487,018 A | * 1/1996 | Loos et al. | 716/11 |
| 5,761,081 A | * 6/1998 | Tomita et al. | 716/6 |
| 5,838,947 A | * 11/1998 | Sarin | 703/14 |
| 5,956,497 A | * 9/1999 | Ratzel et al. | 716/1 |
| 6,278,964 B1 | * 8/2001 | Fang et al. | 703/19 |
| 6,432,731 B1 | * 8/2002 | Kuroiwa | 438/14 |

FOREIGN PATENT DOCUMENTS

| | | |
|---|---|---|
| JP | 5-108753 | 4/1993 |
| JP | 2000-11032 | 1/2000 |

OTHER PUBLICATIONS

Phelps, R.W., "Advanced Library Characterization for High-Performance ASIC," 1991 IEEE, pp. P15-3.1 through P15-3.4.*
Tomita, Y. et al., "Dual Threshold Delay Model for Nonlinear Device Characterization," IEEE 1995 Custom ICs Conference, pp. 371-374.*

* cited by examiner

Primary Examiner—Leigh M. Garbowski
(74) Attorney, Agent, or Firm—McDermott, Will & Emery

(57) ABSTRACT

In order to perform precision delay calculation of a signal of small signal-swing, a delay library in consideration of the small signal-swing making no full swing is generated. It is assumed that a signal having a rising edge and a step waveform which lags the rising edge by a fixed time interval and a signal having a step waveform and a falling edge which lags the step waveform by the fixed time interval are entered as an input signal to a cell. The driving ability of the cell is represented by a function or in a table having as parameters the slews of the rising and falling edges, the fixed time interval and the load capacitance driven by the cell.

6 Claims, 16 Drawing Sheets

```
Delay-lib inverter{
        input terminal                      :A
        output terminal                     :Y
        input signal waveform slew(s)       :t1,t2,t3
        load capacitance (F)                :c1,c2,c3
A->Y:
        cell delay (s)                      :d1,d2,.....
        timing difference (s)               :te1,te2,.....
        first driving ability (s)           :da1_1,da1_2,.....
        second driving ability (s)          :da2_1,da2_2,.....
        third driving ability (s)           :da3_1,da3_2,.....
        fourth driving ability (s)          :da4_1,da4_2,.....
}
```

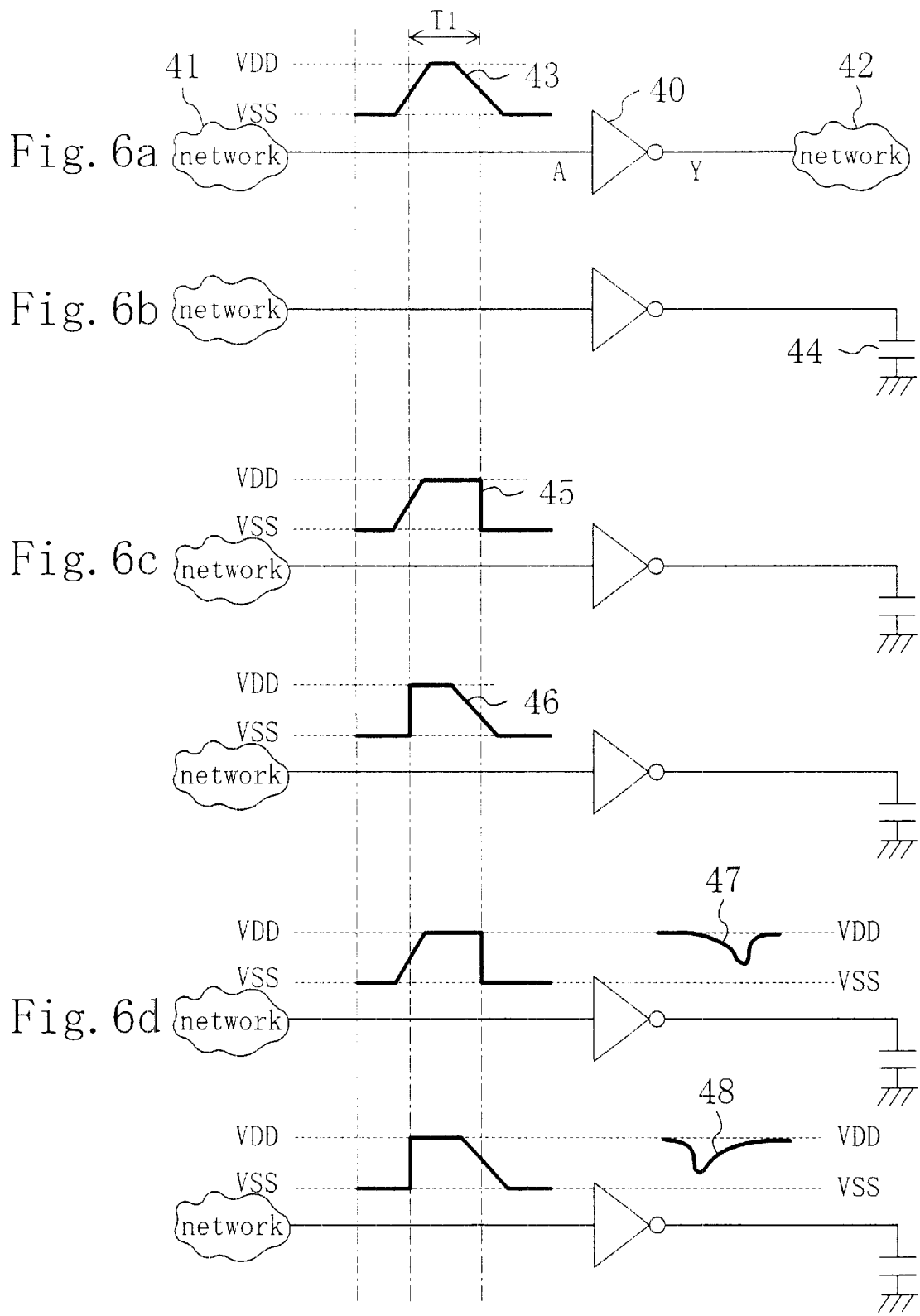

Fig. 11

```
                                                              67
Delay-lib inverter{
        input terminal                          :A
        output terminal                         :Y
        input signal waveform slew              :0.1n, 1.5n
        load capacitance (F)                    :10f, 20f
A->Y:
        cell delay(s) for output rise           :2.0n, 2.1n, 2.2n, 2.3n
        cell delay(s) for output fall           :1.8n, 1.9n, 2.0n, 2.1n
        first full swing check value(s)for rise-fall
                                                :1.0n, 1.1n, 1.2n, 1.3n
        first full swing check value(s)for fall-rise
                                                :0.8n, 0.9n, 1.0n, 1.1n
}
Delay-lib three-input NAND{ input terminal                          :A, B, C
        output terminal                         :Y
        input signal waveform slew              :0.1n, 1.5n
        load capacitance (F)                    :10f, 20f
A->Y:
        cell delay (s) for output rise          :3.0n, 3.1n, 3.2n, 3.3n
        cell delay (s) for output fall          :1.8n, 1.9n, 2.0n, 2.1n
        first full swing check value (s)for rise-fall
                                                :1.0n, 1.1n, 1.2n, 1.3n
        first full swing check value (s)for fall-rise
                                                :1.0n, 1.1n, 1.2n, 1.3n
        second full swing check value (s)for A-rise &B-fall
                                                :1.4n, 1.5n, 1.6n, 1.7n
        second full swing check value (s)for A-rise &C-fall
                                                :1.8n, 1.9n, 2.0n, 2.1n
B->Y:
        cell delay (s)for output rise           :3.4n, 3.5n, 3.6n, 3.7n
        cell delay (s)for output fall           :1.8n, 1.9n, 2.0n, 2.1n
        first full swing check value (s)for rise-fall
                                                :1.4n, 1.5n, 1.6n, 1.7n
        first full swing check value (s)for fall-rise
                                                :1.4n, 1.5n, 1.6n, 1.7n
        second full swing check value (s)for B-rise &A-fall
                                                :1.0n, 1.1n, 1.2n, 1.3n
        second full swing check value (s)for B-rise &C-fall
                                                :1.5n, 1.6n, 1.7n, 1.8n
C->Y:
        cell delay (s)for output rise           :2.4n, 2.5n, 2.6n, 2.7n
        cell delay (s)for output fall           :1.8n, 1.9n, 2.0n, 2.1n
        first full swing check value (s)for rise-fall
                                                :0.3n, 0.4n, 0.5n, 0.6n
        first full swing check value (s)for fall-rise
                                                :0.3n, 0.4n, 0.5n, 0.6n
        second full swing check value (s)for C-rise &A-fall
                                                :1.0n, 1.1n, 1.2n, 1.3n
        second full swing check value (s)for C-rise &B-fall
                                                :0.1n, 0.2n, 0.7n, 0.8n
}
```

Fig. 13

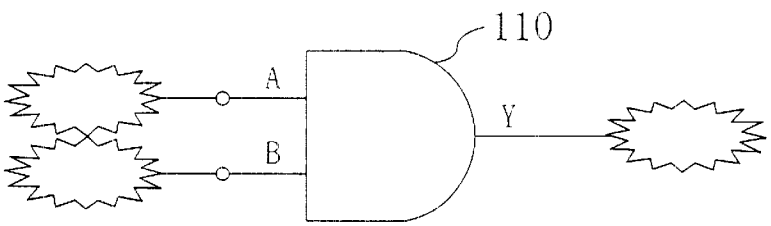

timing information 105

```
110:A   16.0n   1.0n   rise
110:A   25.0n   0.5n   fall
        ...
110:B   17.0n   0.5n   fall
110:B   26.0n   1.0n   rise
``` delay library 102

```
input NAND{
    input terminal              : A, B
    output terminal             : Y
    input signal waveform slew  : t1, t2, t3
    load capacitance            : c1, c2, c3
A->Y:
    cell delay (s)for output rise : d_r_t1c1,...,d_r_t3c3
    cell delay (s)for output fall : d_f_t1c1,...,d_f_t3c3
    first full swing check value (s)for rise-fall
                                  : fc1_r_t1t1c1,...,fc1_r_t3t3c3
    first full swing check value (s)for fall-rise
                                  : fc1_f_t1t1c1,...,fc1_f_t3t3c3
    second full swing check value (s)for A-rise&B-fall
                                  : fc2_t1t1c1,...,fc2_t3t3c3
B->Y:
    cell delay (s)                : ...
    first full swing check value (s) : ...
    second full swing check value (s) : ...
}
```

Fig. 15a
PRIOR ART
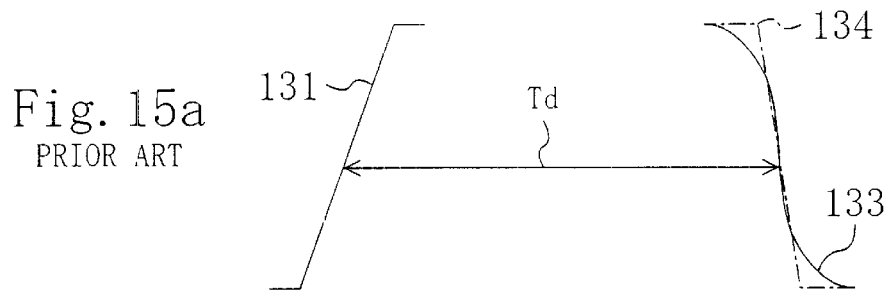
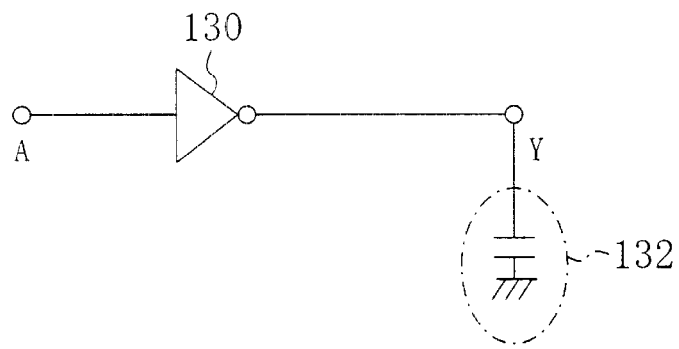
Fig. 15b
PRIOR ART
| input waveform slew | load capacitance | cell delay time | output waveform slew |
|---|---|---|---|
| input_slew_1 | load_1 | delay_1×1 | output_slew_1×1 |
| ... | ... | ... | ... |
| input_slew_m | load_n | delay_m×n | output_slew_m×n |

DELAY LIBRARY REPRESENTATION METHOD, DELAY LIBRARY GENERATION METHOD AND DELAY CALCULATION METHOD USING THE DELAY LIBRARY

BACKGROUND OF THE INVENTION

The present invention relates to a delay library for setting a delay time in a logic cell which is a delay element in a logic circuit, to a method for generating the delay library and to a delay calculation method using the delay library.

Prior art methods will be described with reference to FIGS. 15(a), 15(b) and 16. As shown in FIG. 15(a), in a prior art method for generating a delay library, an input signal waveform 131 given to an input terminal A of a cell 130 and load capacitance 132 connected to an output terminal Y are put through a circuit simulation using a circuit simulator like SPICE so as to calculate a cell output signal waveform 133. Based on the input signal waveform 131 and the cell output signal waveform 133, a cell delay time Td is calculated using the predetermined threshold voltage of the cell 130. The cell output signal waveform 133 is linear-fitted to calculate a cell output signal waveform 134. The cell delay time Td and the cell output signal waveform 134 thus calculated are represented in tabular form which uses the input signal waveform 131 and the load capacitance 132 as parameters as shown in FIG. 15(b).

In calculating a cell delay time and a cell output signal waveform using the table shown in FIG. 15(b), when the value of an input signal waveform slew and the value of load capacitance are both shown in the table, the cell delay time and the cell output signal waveform corresponding to these vales are found. If either of these values is not shown in the table, the value of the input signal waveform slew and the value of the load capacitance registered with the table are interpolated to find the cell delay time and the cell output signal waveform.

As shown in FIG. 16, another method for calculating a cell output signal waveform is to model the driving ability of the cell by using a NMOS type transistor when the cell output signal waveform falls, and a PMOS type transistor when the waveform rises. FIG. 16 shows the case where the cell output signal waveform falls.

The signal waveform in an output node 142 which is shaped when a step waveform 143 rising at the time t=0 is entered at the gate terminal 141 of a NMOS type transistor 140 is referred to as the output signal waveform of the cell. When the cell drives a network 144, the signal waveform in the output node 142 is calculated by connecting the network 144 to the output node 142, and solving the circuit equation to find the cell output signal waveform.

In a prior art logic simulation method, the propagation delay time of a signal traveling through the gate is represented by a function of either the rise time or the fall time between the, VSS and the VDD of the signal entered at the gate (Refer to Japanese Laid-open Patent Application No. 5-108753). It is possible to represent fluctuations in the delay time affected by the signal waveform, thereby achieving accurate estimation of the delay time.

Problems to be Solved

A prior art delay library is formed on the assumption that the input/output signal waveforms of the cell make a full transition between the power potential VDD and the ground potential VSS. This involves a problem that when a so-called small signal-swing occurs in the actual circuit operation, or when a waveform does not make a full transition between the power potential VDD and the ground potential VSS, the delay time is not calculated accurately.

The prior art logic simulation method requires a signal waveform that makes a full transition between the power potential VDD and the ground potential VSS. Therefore, when the signal waveform fails to make a full transition between the power potential VDD and the ground potential VSS due to high-rate changes of the signal, with improving operating frequency of LSI, there is a problem that the signal potential changes less, thereby shortening the transition time of the signal.

SUMMARY OF THE INVENTION

The present invention has an object of providing a method for representing a delay library which can deal with signal waveforms of small signal-swing and a method for generating the delay library. The present invention has another object of providing a delay calculation method using the delay library.

To be more specific, the present invention discloses a method for representing a delay library used for delay calculation of a cell by assuming that a signal having a first edge and a step waveform which lags the first edge by a fixed time interval, and a signal having a step waveform and a second edge which lags the step waveform by said fixed time interval as an input signal to said cell, and representing a driving ability of said cell either by a function or in a table having as parameters a slew of the first edge, a slew of the second edge, said fixed time interval and load capacitance driven by said cell.

The present invention also disclosed a method for generating a delay library used for delay calculation of a cell, comprising: a first step of finding output signal waveforms of said cell, based on combinations of input signal waveforms and output load capacitances; a second step of determining whether each of the output signal waveforms found in the first step makes a full swing or not; a third step of generating a first delay library from the combinations of the input signal waveforms and output load capacitances concerned with the output signal waveforms that have been determined to make a full swing in the second step; a fourth step of generating a second delay library from the combinations of the input signal waveforms and output load capacitances concerned with the output signal waveforms that have been determined not to make a full swing in the second step; and a fifth step of generating a delay library of said cell by synthesizing the first delay library and the second delay library.

The present invention further discloses a method for calculating a delay time of a cell, comprising: a first step of dividing an input signal waveform having a first edge and a second edge which lags the first edge by a fixed time interval into a first division waveform having the first edge and a step waveform which lags the first edge by said fixed time interval, and a second division waveform having a step waveform and the second edge which lags the step waveform by said fixed time interval, by using said delay library represented by the method of claim 1; a second step of finding, with reference to said delay library, a first output signal waveform which is an output signal waveform shaped when the first division waveform is entered at said cell and a second output signal waveform which is an output signal waveform shaped when the second division waveform is entered at said cell; and a third step of finding an output signal waveform of said cell by synthesizing the first output signal waveform and the second output signal waveform, and said delay time of said cell being calculated based on the input signal waveform, and the output signal waveform found in, the third step.

The present invention further discloses a method for representing a delay library used for delay calculation of a cell by assuming that a signal having a first edge and a second edge which lags the first edge by a fixed time interval is entered as an input signal to said cell, and representing a value of said fixed time interval required for an output signal waveform to make a full swing as a full swing check value when said input signal is entered at said cell either by a function or in a table having as parameters a slew of the first edge and load capacitance driven by said cell.

The present invention further discloses a method for generating a delay library used for delay calculation of a cell, comprising: a first step of finding an output signal waveform of said cell, based on an input signal waveform having a first edge and a second edge which lags the first edge by a fixed time interval, and on output load capacitance; a second step of determining whether the output signal waveform found in the first step makes a full swing or not; and a third step of changing a value of said fixed time interval when the output signal waveform is determined not to make a full swing in the second step, and repeating the first to third step to find the value of said fixed time interval required for the output signal waveform of said cell to make a full swing as a full swing check value, and thereby to generate said delay library by using said full swing check value.

BRIEF DESCRIPTION OF THE DRAWINGS

FIG. 4 is a diagram showing an example of the second delay library shown in FIG. 1.

FIGS. 6(a) to 6(d) are diagrams for explaining Steps S21 and S22 in the flowchart shown in FIG. 5.

FIG. 11 is a diagram showing an example of the representation of the delay library shown in FIG. 8.

FIG. 13 is a diagram for explaining Step S44 in the flowchart shown in FIG. 12.

FIGS. 15(a) and 15(b) are diagrams showing a prior art method for characterizing a cell delay time and a cell output signal waveform.

DETAILED DESCRIPTION OF THE INVENTION

The embodiments of the present invention will be described as follows with reference to the drawings.

Embodiment 1

Figure 1:
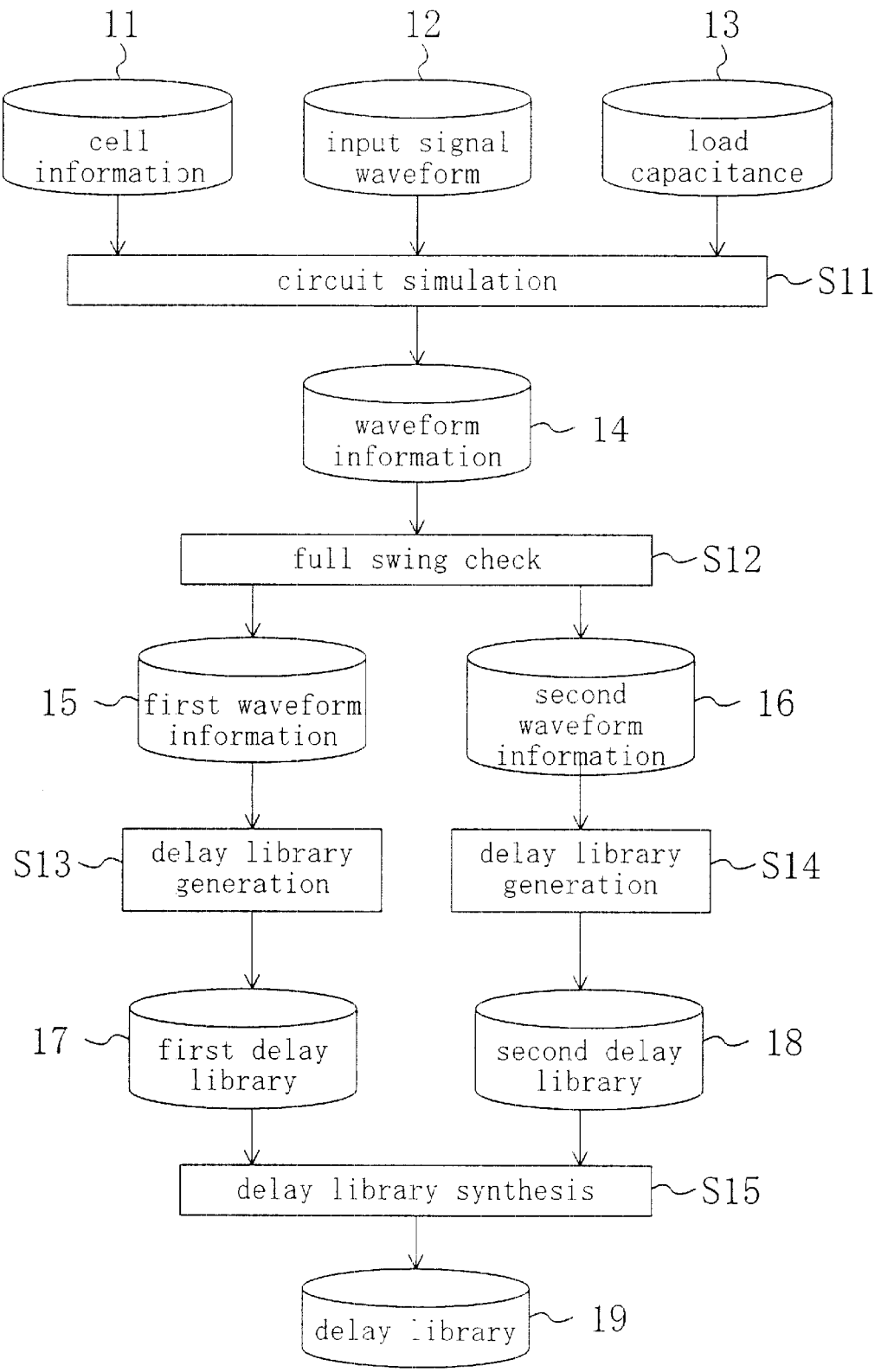
FIG. 1 is a flowchart showing a delay library generation method in accordance with the first embodiment of the present invention.

FIG. 1 is a flowchart showing a delay library generation method in accordance with the first embodiment of the present invention.

First, at Step S11, a circuit simulation is performed by using cell information 11, an input signal waveform 12 and load capacitance 13 to generate waveform information 14 showing the output signal waveform of the cell.

Figure 2A:
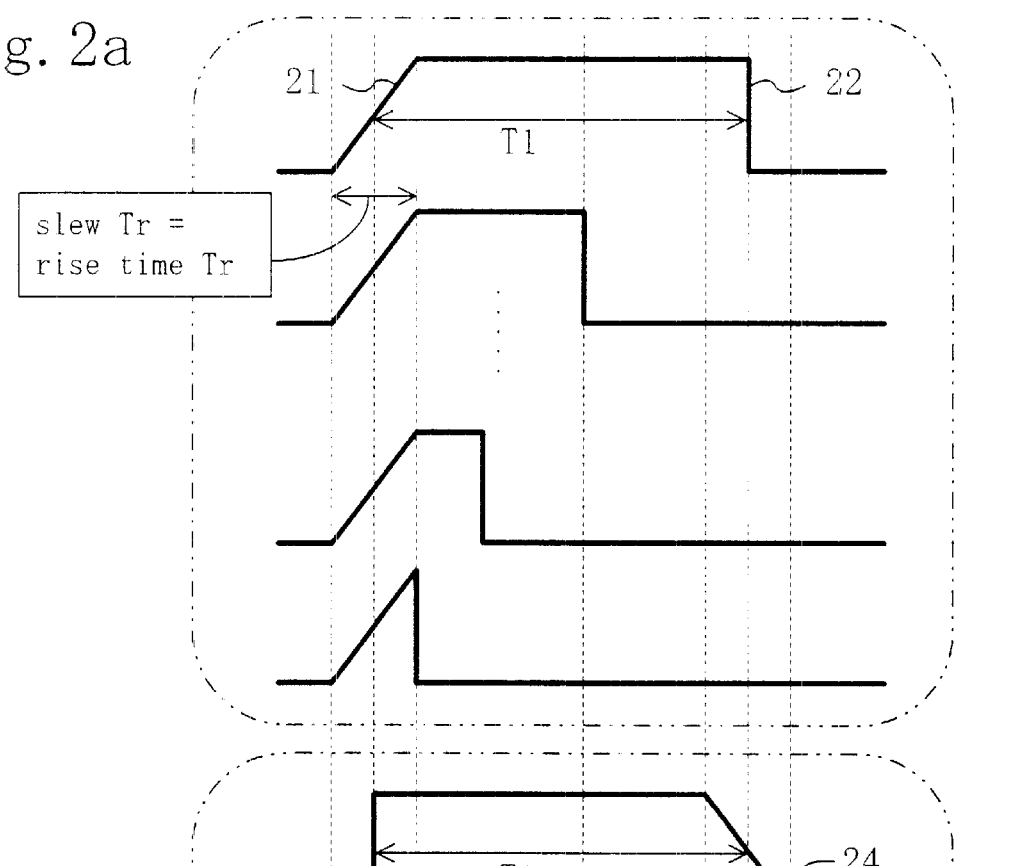
FIGS. 2(a) and 2(b) are diagrams showing input signal waveforms used in the first embodiment of the present invention.
Figure 2B:
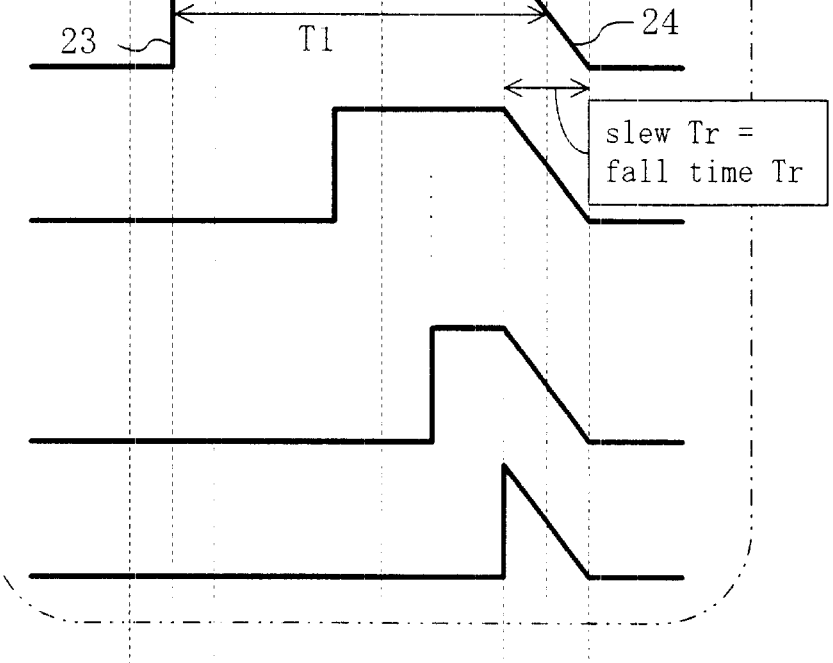

FIGS. 2(a) and 2(b) are diagrams showing the input signal waveform 12 used in the present embodiment. In the diagrams, the following four kinds of signal waveforms are used as the input signal waveform.

(1) A signal having a rising edge 21 with a slew Tr and a falling step waveform 22 which lags the edge 21 by a fixed timing difference (fixed time interval) T1 (FIG. 2(a))

The timing difference T1 is a time interval between when the rising edge 21 reaches a predetermined potential and when the step waveform 22 completes a transition. The predetermined potential can be, for example, a threshold voltage.

(2) A signal having a rising step waveform 23 and a falling edge 24 with a slew Tr which lags the waveform 23 by the fixed timing difference T1 (FIG. 2(b)).

(3) A signal which shapes a transition waveform reverse to the signal of (1)

(4) A signal which shapes a transition waveform reverse to the signal of (2)

It must be noted that the timing difference T1 has the same values in the signals (1) through (4). For example, when the signal (1) with a slew Tr of 2.0 ns has three values: 1.0 ns, 1.1 ns and 1.2 ns for the timing difference T1 , the signals (2) through (4) are supposed to have the same three values for the timing difference T1 . In addition, the slew Tr is supposed to have at least one value, and the load capacitance 13 is supposed to have at least one value.

Figure 3A:
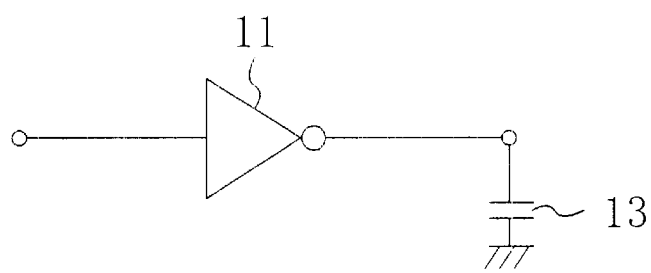
FIGS. 3(a) to 3(c) are diagrams for explaining the circuit simulation in Step S11 in the flowchart shown in FIG. 1.
Figure 3B:
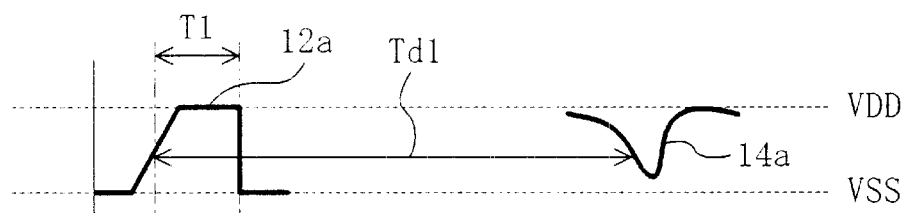
Figure 3C:
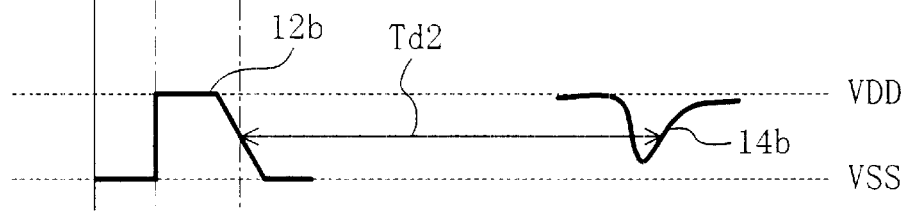

FIGS. 3(a) to 3(c) are diagrams for explaining the circuit simulation at Step S11 . In FIG. 3(a), the cell 11 is provided with an inverter function. FIG. 3(b) shows an output signal waveform 14a shaped when the signal 12a of (1) is entered, and FIG. 3(c) shows an output signal waveform 14b shaped when the signal 12b of (2) is entered.

The cell delay time is defined here as the time interval between the edge of an input signal that is not a step waveform and the edge of an output signal which appears after the propagation of the cell.

For example, as shown in FIG. 3(b), when the signal 12a of (1) is entered, the time interval Td1 from the rising edge of the input signal 12a to the falling edge of the output signal 14a which appears after the propagation of the cell 11 is regarded as the delay time of the cell 11. Similarly, as shown in FIG. 3(c), when the signal 12b of (2) is entered, the time interval Td2 from the falling edge of the input signal 12b to the rising edge of the output signal 14b which appears after the propagation of the cell 11 is regarded as the delay time of the cell 11. The same definition of the delay time holds true for the signals (3) and (4).

It must be noted that when the output signal waveform does not pass through the threshold voltage, the cell delay time is assumed not to exist. For example, when the output signals 14a and 14b shown in FIGS. 3(b) and 3(c) do not pass through their threshold voltage, it is assumed that the output signal of the cell 11 has no change.

Then, at Step S12, it is determined whether each output signal waveform contained in the waveform information 14 makes a full swing or not to divide the waveform information 14 into first waveform information 15 containing output signal waveforms which make a full swing and second waveform information 16 containing output signal waveforms which do not make a full swing.

At Step S13, a first delay library 17 is generated from the first waveform information 15 containing the output signal waveforms which make a full swing. The delay times Td1 and Td2 of the cell may be represented by a multi-order function or in tabular form having the slew Tr of the edge of the input signal waveform 12 that is not the step waveform and the load capacitance 13 as parameters. Moreover, other information like the driving ability of the cell can be added to the parameters.

At Step S14, a second delay library 18 is generated from the second waveform information 16 containing the output signal waveforms which do not make a full swing.

FIG. 4 shows an example of the second delay library 18. As shown in the example, the second delay library 18 includes the slews of input signal waveforms, the values of the load capacitance and the delay times of a cell. Similar to the first delay library 17, the delay time of the cell can be represented by a multi-order function or in tabular form having the slew of the edge of the input signal waveform that is not the step waveform and the load capacitance as parameters.

In the second delay library 18, four driving abilities are defined. The first, second, third and four the driving abilities correspond to the driving abilities when the signals of (1), (2), (3) and (4) are entered, respectively. Similar to the delay time of the cell, each of these driving abilities is represented by a multi-order function or in tabular form having as parameters the slew of the edge of a respective one of the signals (1) to (4) that is not the step waveform, the load capacitance and the timing difference.

At Step S15, the first delay library 17 and the second delay library 18 are synthesized to generate a delay library 19 of the cell 11.

As described herein before, representing an input signal waveform of a cell as a group of plural signal waveforms in characterizing the delay library of the cell makes it possible to generate the delay library of the cell in consideration of the case where an output signal waveform of the cell does not make a full swing.

When a single signal waveform is entered as the input signal waveform like in the prior art, instead of a group of the plural signal waveforms, there is no signal waveform to be classified as the second waveform information 16 at Step S12 (when the input signal waveform is a single signal waveform, all the output signal waveforms make a full swing), which makes it possible to generate a conventional general delay library.

Although the above description deals with a cell having a single input terminal, a delay library can be generated in the same manner when a cell has more than one input terminal like a two-input NAND.

Embodiment 2

Figure 5:
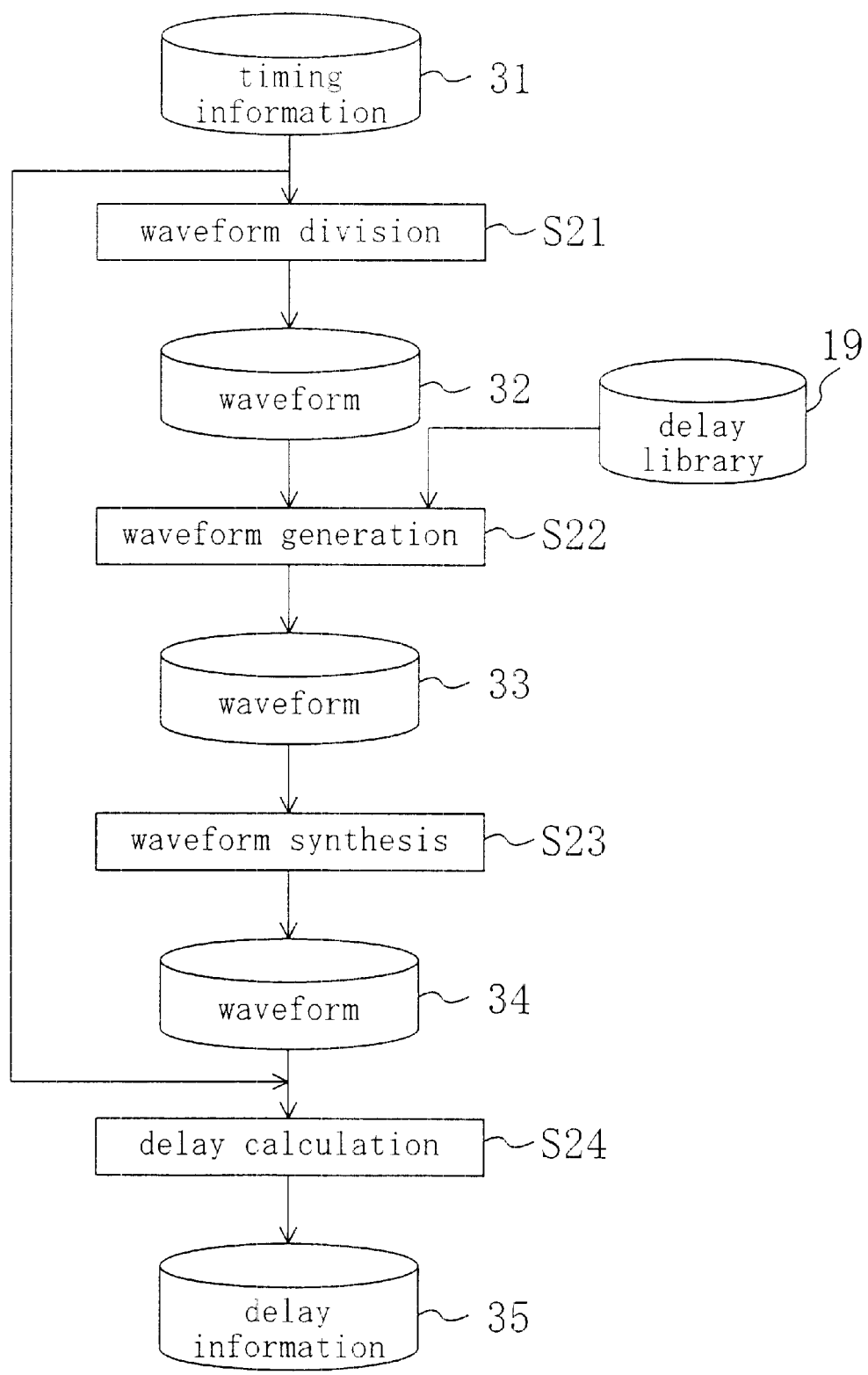
FIG. 5 is a flowchart showing a delay calculation method in accordance with the second embodiment of the present invention.

FIG. 5 is a flowchart showing a delay calculation method in accordance with the second embodiment of the present invention. Timing information 31 includes the transition direction and transition time of signal waveforms and the slews of edges in all nodes contained in a circuit.

First of all, at Step S21, the signal waveforms contained in the timing information 31 are divided into the four kinds of signals described in the first embodiment to be represented by a combination of these divided waveforms, and outputted as a waveform 32. At Step S22, an output signal waveform shaped when the divided waveforms contained in the waveform 32 is entered is generated by referring to the delay library 19 generated in the first embodiment, and outputted as a waveform 33.

By using FIGS. 6(a) to 6(d), the waveform division step S21 and the waveform generation step S22 will be described as follows. In FIG. 6(a), it is assumed that an input signal 43 having a rising edge and a falling edge which lags the rising edge by the fixed time interval T1 is entered at an inverter cell 40 having an input terminal A connected to a network 41 and an output terminal Y connected to a network 42. The fixed time interval T1 is represented by the time difference between when the rising edge passes through the predetermined voltage and when the falling edge passes through the predetermined voltage.

First, as shown in FIG. 6(b), the network 42 on the output side is replaced by effective capacitance 44 which has the equivalent response at the output terminal of the cell 40. Then, as shown in FIG. 6(c), the input signal 43 is divided into a first division waveform 45 (the above-mentioned signal of (1)) having a rising edge and a step waveform which lags the edge by the fixed time interval T1, and a second division waveform 46 having a step waveform and a falling edge which lags the waveform by the fixed time interval T1. The rising edge of the first division waveform 45 has the same slew as the rising edge of the input signal 43, and the falling edge of the second division waveform 46 has the same slew as the falling edge of the input signal 43.

Then, as shown in FIG. 6(d), a first output signal waveform 47 shaped when the first division waveform 45 is entered at the cell 40 and a second output signal waveform 48 shaped when the second division waveform 46 is entered at the cell 40 are found by referring to the delay library 19 shown in the first embodiment. By using the first to fourth driving abilities contained in the delay library 19 and the load capacitance 44, a circuit equation at the output terminal of the cell 40 is formulated and solved to find the first and second output signal waveforms 47 and 48.

At Step S23, the output signal waveform of the waveform 33 is synthesized to find the output signal waveform corresponding to the input signal waveform, thereby to generate a waveform 34. At Step S24, the cell delay time is calculated from the input signal waveform contained in the timing information 31 and the output signal waveform contained in the waveform 34 so as to generate delay information 35.

Figure 7A:
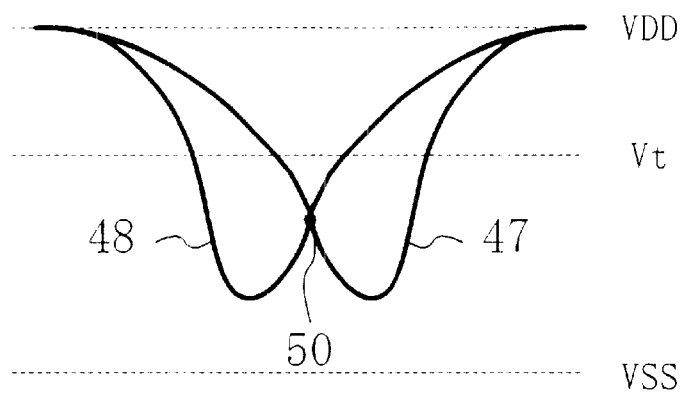
FIGS. 7(a) to 7(c) are diagrams for explaining Steps S23 and S24 in the flowchart shown in FIG. 5.
Figure 7B:
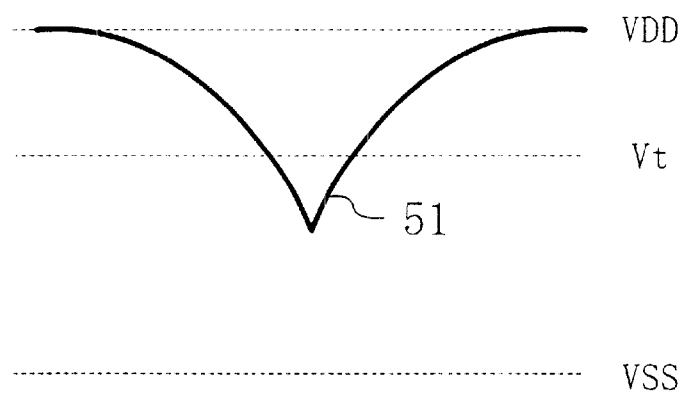
Figure 7C:
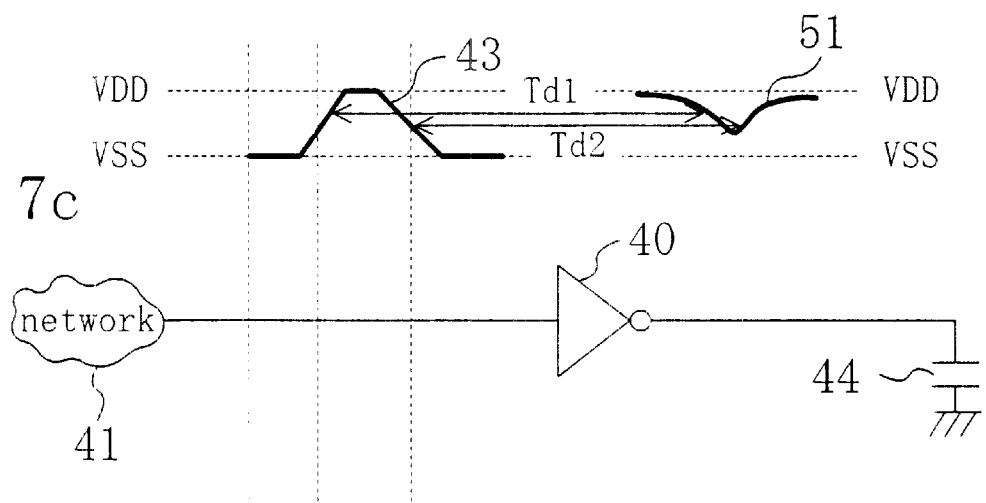

With reference to FIGS. 7(a) to 7(c), the waveform synthesis step S23 and the delay calculation step S24 will be described as follows, on the assumption that the first and second output signal waveforms 47 and 48 shown in FIG. 7(a) are obtained.

In the input signal waveform 43, the rising edge and the falling edge are represented by the first division waveform 45 and the second division waveform 46, respectively. Therefore, the influence of the rising edge of the input signal 43 on the output signal of the cell 40 is equivalent to the influence of the rising edge of the first division waveform 45, and this appears at the falling portion of the first output signal waveform 47. On the other hand, the influence of the falling edge of the input signal 43 on the output signal of the cell 40 is equivalent to the influence of the falling edge of the second division waveform 46, and this appears at the rising portion of the second output signal waveform 48.

As shown in FIG. 7(b), with the intersection 50 of the first and second output signal waveforms 47 and 48 as a change point, the first output signal waveform 47 from the VDD to the intersection 50 and the second output signal waveform 48 from the intersection 50 to the VDD are synthesized to shape an output signal waveform 51.

It must be noted that when the intersection 50 fails to exceed the threshold voltage Vt, that is, when the intersection 50 does not go below the threshold voltage Vt in the transition from the VDD to the VSS, and when the intersection 50 does not go beyond the threshold voltage Vt in the transition from the VSS to the VDD, even if the output signal waveform 51 is entered at a cell which is driven by the cell 40, the cell to be driven does not operate. Therefore, in this case, the output signal waveform is treated as a signal with no change at all.

As a result of the waveform synthesis, the input signal waveform 43 and the output signal waveform 51 have the relation shown in FIG. 7(c). The time interval Td1 from when the input signal waveform 43 reaches the threshold value for the first time to when the output signal waveform 51 reaches the threshold value for the first time is found as the delay time of the cell corresponding to the rising edge of the input signal waveform 43. Similarly, the time interval Td2 from when the input signal waveform 43 reaches the threshold value for the second time to when the output signal waveform 51 reaches the threshold value for the second time is found as the delay time of the cell corresponding to the falling edge of the input signal waveform 43.

As described herein before, according to the present embodiment, the use of the delay library shown in the first embodiment makes it possible to find a signal waveform that does not make a full swing, without a circuit simulation, which has been able to be found only through a circuit simulation.

Embodiment 3

Figure 8:
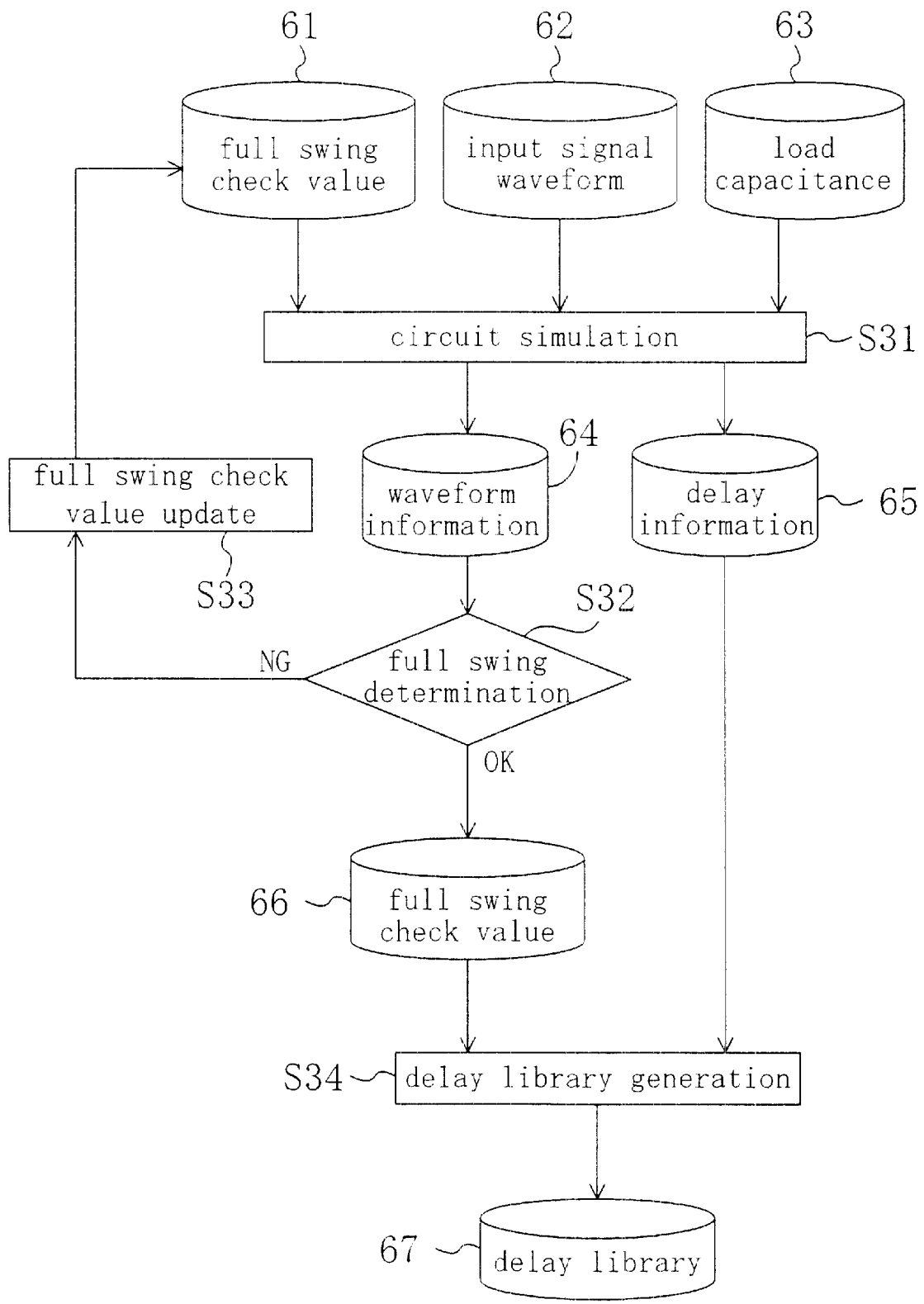
FIG. 8 is a flowchart showing a delay library generation method in accordance with the third embodiment of the present invention.

FIG. 8 is a flowchart showing a delay library generation method in accordance with the third embodiment of the present invention. The present embodiment includes a new concept of a full swing check value, so the following description will begin with the introduction of the concept. The full swing check value has two types: the first full swing check value represents the timing difference between plural signals entered at one terminal, and the second full swing check value represents the timing difference between signals entered at two or more input terminals.

First, the first full swing check value will be described with reference to FIGS. 9(a) to 9(c).

Figure 9A:
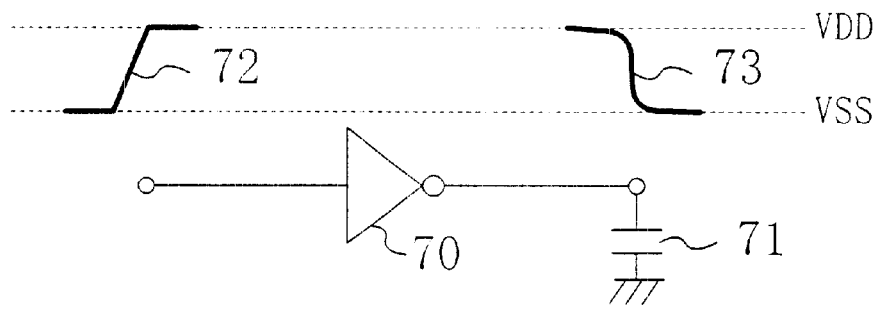
FIGS. 9(a) to 9(c) are diagrams for explaining a first full swing check value.

As shown in FIG. 9(a), when an input signal 72 having a rising edge is entered at a cell 70 having output load capacitance 71, an output signal 73 having a falling edge is outputted. When the input signal 72 has the rising edge only, the output signal 73 makes a full transition from the VDD to the VSS (this condition is referred to as making a full swing).

Figure 9B:

However, as shown in FIG. 9(b), when an input signal 74 has a rising edge and a falling edge which lags the rising edge by a minute timing difference Ta, the output signal 75 begins to make a transition towards the VDD before completing the transition from the VDD to the VSS due to the influence of the falling edge of the input signal 74, thereby shaping a waveform which does not make a full transition from the VDD to the VSS.

Figure 9C:
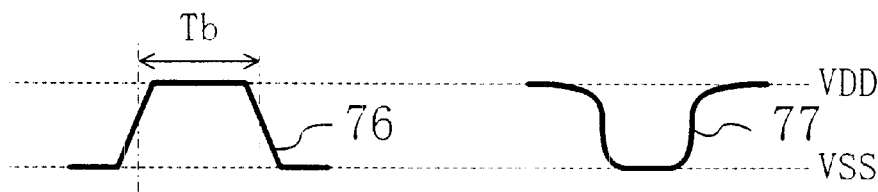

On the other hand, as shown in FIG. 9(c), when an input signal 76 has a rising edge and a falling edge which lags the rising edge by a sufficient timing difference Tb, an output signal 77 makes a transition towards the VDD due to the influence of the falling edge of the input signal 76 after completing a transition from the VDD to the VSS.

Thus, the output signal makes a full swing (output signal 77) or does not (output signal 75), depending on the magnitude of the timing difference Ta or Tb between the rising edge and the falling edge of each of the input signals 74 and 76.

The minimum value of the timing difference required for an output signal to make a full swing is defined as a first full swing check value Tfc1. Here, the following formula holds:

$Ta < Tfc1 < Tb$

When the rising edge and the falling edge are entered at the cell 70 with a smaller timing difference than the first full swing check value Tfc1, the output signal does not make a full swing, while when these edges are entered at the cell 70 with a larger timing difference than the value Tfc1, the output signal makes a full swing without fail.

Then, the second full swing check value will be described with reference to FIGS. 10(a) to 10(c).

Figure 10A:
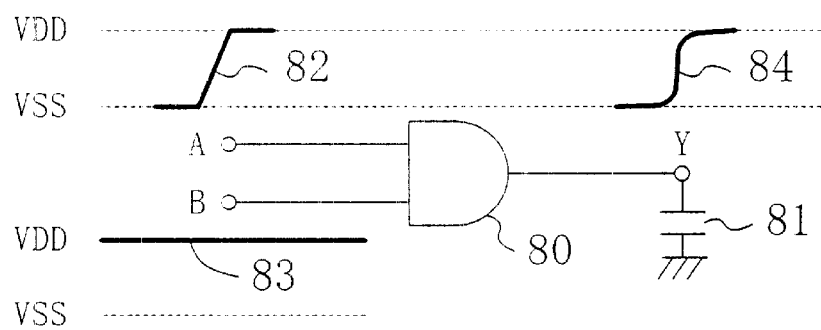
FIGS. 10(a) to 10(c) are diagrams for explaining a second full swing check value.

As shown in FIG. 10(a), when a rising signal 82 is entered at an input terminal A of a multi-input cell (AND gate) 80 having output load capacitance 81, and when the other input terminal B of the cell 80 is fixed at the VDD, an output signal 84 which makes a full swing is outputted to the output terminal Y of the cell 80.

The following will describe the case where the input terminal B receives the falling signals 85 and 87 which fall the fixed timing differences Ta and Tb, respectively, behind the rising edge of the rising signal 82. It is assumed that the timing difference T is a minute time interval, and the timing difference Tb is a time interval far larger than the timing difference Ta.

From the circuit properties of the AND gate, when a falling signal is entered at the input terminal B, the output signal of the cell 80 will fall.

Figure 10B:
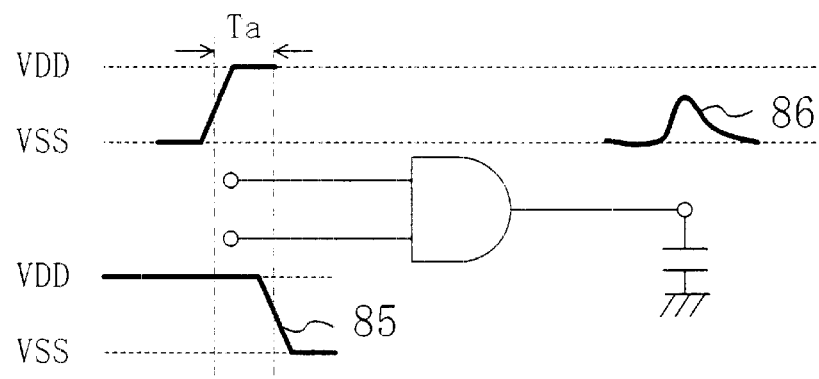

However, as shown in FIG. 10(b), when the timing difference Ta between the rising signal 82 and the falling signal 85 is minute, the output signal 86 begins to rise according to the rising signal 82, but begins to make a transition towards the VSS due to the influence of the falling signal 85 before completing a full transition from the VSS to the VDD. As a result, a signal waveform which does not make a full swing is obtained.

Figure 10C:
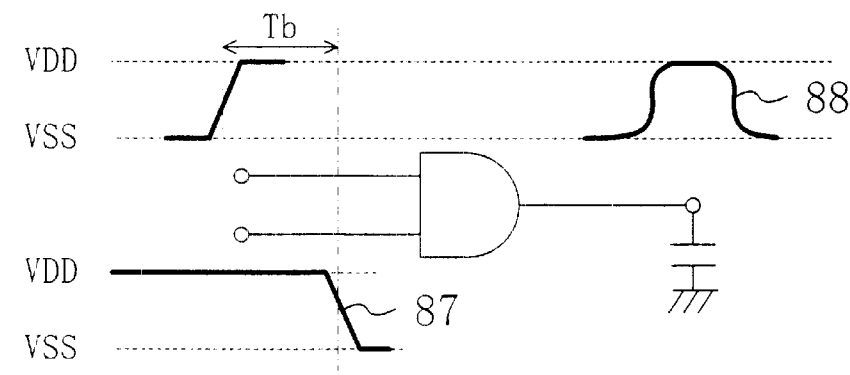

On the other hand, as shown in FIG. 10(c), when the timing difference Tb between the rising signal 82 and the falling signal 87 is large enough, the output signal 88 makes a full transition from the VSS to the VDD, and then makes a full transition from the VDD to the VSS. As a result, a signal waveform which makes a full swing is obtained.

The minimum value of the timing difference required for an output signal to make a full swing is defined as a second full swing check value Tfc2. Here, the following formula holds:

$Ta < Tfc2 < Tb$

Similar to the first full swing check value, when the timing difference between the rising and falling signal waveforms between different input terminals is smaller than the second full swing check value Tfc2, the output signal never makes a full swing as shown in FIG. 10(b). In contrast, when the timing difference between the rising and falling signal waveforms between the different input terminals is larger than the second full swing check value Tfc2, the output signal makes a full swing without fail as shown in FIG. 10(c).

A method for calculating the first and second full swing check values will be described in accordance with the flowchart shown in FIG. 8.

First of all, at Step S31, a circuit simulation is performed by using a full swing check value 61, an input signal waveform 62 and load capacitance 63 so as to generate waveform information 64 and delay information 65. The input signal waveform 62 is a signal waveform having a rising edge and a falling edge with a timing difference as shown in FIGS. 9(b) and 9(c). The load capacitance 63 corresponds to the load capacitance 71 shown in FIG. 9(a).

The full swing check value 61 stores as initial values (1) the timing difference Ta when the output signal of a cell does not make a full swing, and (2) the timing difference Tb when the output signal of the cell makes a full swing. One method for setting the initial values is to set 0s as the timing difference Ta, which satisfies the requirement (1) and to set an extremely large value around 100 ns as the timing difference Tb, which satisfies the requirement (2).

As a result of the circuit simulation, the output signal waveforms 75 and 77 shown in FIGS. 9(b) and 9(c) are stored in the waveform information 64.

At Step S32, based on the waveform information 64, it is determined whether the two timing differences Ta and Tb satisfy the following three requirements.

(1) With the timing difference Ta, the output signal of the cell does not make a full swing (2) With the timing difference Tb, the output signal of the cell makes a full swing (3) The difference between the timing differences (Ta−Tb) is below the minute fixed value When the above three requirements are satisfied, it is determined to be OK, and the mean value of the timing differences Ta and Tb is outputted as a full swing check value 66. When the three requirements are not satisfied, it is determined to be NG, and the process proceeds to step S33.

At Step S33, the timing differences Ta and Tb are updated and outputted as a new full swing check value 61. The update of the timing differences Ta and Tb can be performed as follows.

When the requirement (1) is not satisfied
The timing difference Ta is changed to Ta' (Ta'<Ta<Tb).
When the requirement (2) is not satisfied
The timing difference Tb is changed to Tb'(Ta<Tb<Tb').
When the requirement (3) is not satisfied Either the timing difference Ta is changed to Tan (Ta<Ta"<Tb) or the timing difference Tb is changed to Tb"(Ta <Tb"<Tb).

Although this is a simple update method, it would be more effective to employ an algorithm like a bisection method.

By using the updated full swing check value 61, a circuit simulation is performed at Step S31. The processes from Step S31 to Step S33 are repeated until the three requirements are satisfied.

At Step S34, a delay library 67 is generated by using the full swing check value 66 and the delay information 65. In this case, the delay library 67 is generated in compliance with the format unique to the delay calculation tool which uses the delay library 67.

Although the above description deals with the method for calculating the first full swing check value only, the second full swing check value can be calculated in the same manner.

In addition, the above description shows the case where a rising signal waveform is entered before a falling signal waveform is entered; however, the same calculation can be applied when a falling signal waveform is entered before a rising signal waveform is entered.

FIG. 11 shows an example of the representation of the delay library 67. In the example, the delay library 67 includes the slews of input signal waveforms, load capacitance, cell delays and a first and second full swing check values as its components. It may further include other information.

The slews of an input signal waveform indicate the slews of the rising signal waveform and the falling signal waveform. The cell delay indicates a delay time calculated based on the latter-entered signal waveform of the slews of the input signal waveform and on the signal waveform outputted when the latter-entered signal waveform is propagated in the cell. The latter-entered signal waveform indicates a falling waveform when it is entered a fixed timing difference after a rising waveform is entered, and indicates the rising waveform when it is entered the fixed timing difference after the falling waveform is entered. For example, in the case shown in FIG. 9(c), the time interval from when the falling edge of the input signal 76 goes below the threshold voltage to when the rising edge of the output signal 77 goes beyond the threshold voltage is represented by the cell delay.

Therefore, the cell delay is represented by a multi-order function or in tabular form with the slew of the latter-entered signal waveform (edge) of the slews of the input signal waveform and the load capacitance. The cell delay exists in each combination of an input signal waveform slew and load capacitance. The example shown in FIG. 11 includes two input signal waveform slews and two load capacitances, so that there are eight cell delays in all: four for the rising and four for the falling of the signals.

The first full swing check value is represented by a function of the load capacitance and the slews of the input signal waveform.

In FIG. 11, the input signal waveform has two slews of rising and falling, and the load capacitance also has two values, so that there are eight (=2×2×2) full swing check values.

Since the inverter has only one input, the first full swing check value only is shown. As for the three-input NAND gate, each input A, B and C has the first full swing check value and two kinds of second full swing check values. For example, the two kinds of second full swing check values for the input A indicate the second full swing check value between the inputs A and B and the second full swing check value between the inputs A and C.

The second full swing check values differ in number from the cell delays and the first full swing check values. The reason for this is that in a multi-input cell, there may be cases where output signals do not make a full swing, depending on the combination of input signals.

Now, assuming that in a three-input NAND gate, the input C is fixed at the VDD (when the input C is at the VSS, the output remains at the VDD without changing at all even if the signals of the inputs A and B change), the output signal makes a swing only when the former-entered signal rises from the VSS and the latter-entered signal falls from the VDD. In this case, the output signal falls from the VDD, and then rises from the VSS. In contrast, in the combination of the other input signals, the output signal makes only one transition at most.

Therefore, the check of whether the output signal makes a full swing or not is required only when the former signal rises from the VSS and the latter signal falls from the VDD, so that the second full swing check value in this case only can be registered in the delay library. Since the example shown in FIG. 11 includes two input signal waveform slews and two load capacitances, every combination of input signals has four second full swing check values.

There are different types of combinations of input signals which cause an output signal to make a swing, depending on the logic of the cell. The number of the second full swing check value, which must be set for each combination of input signals causing the output signal to make a swing, differs depending on the logic of the cell.

Figure 12:
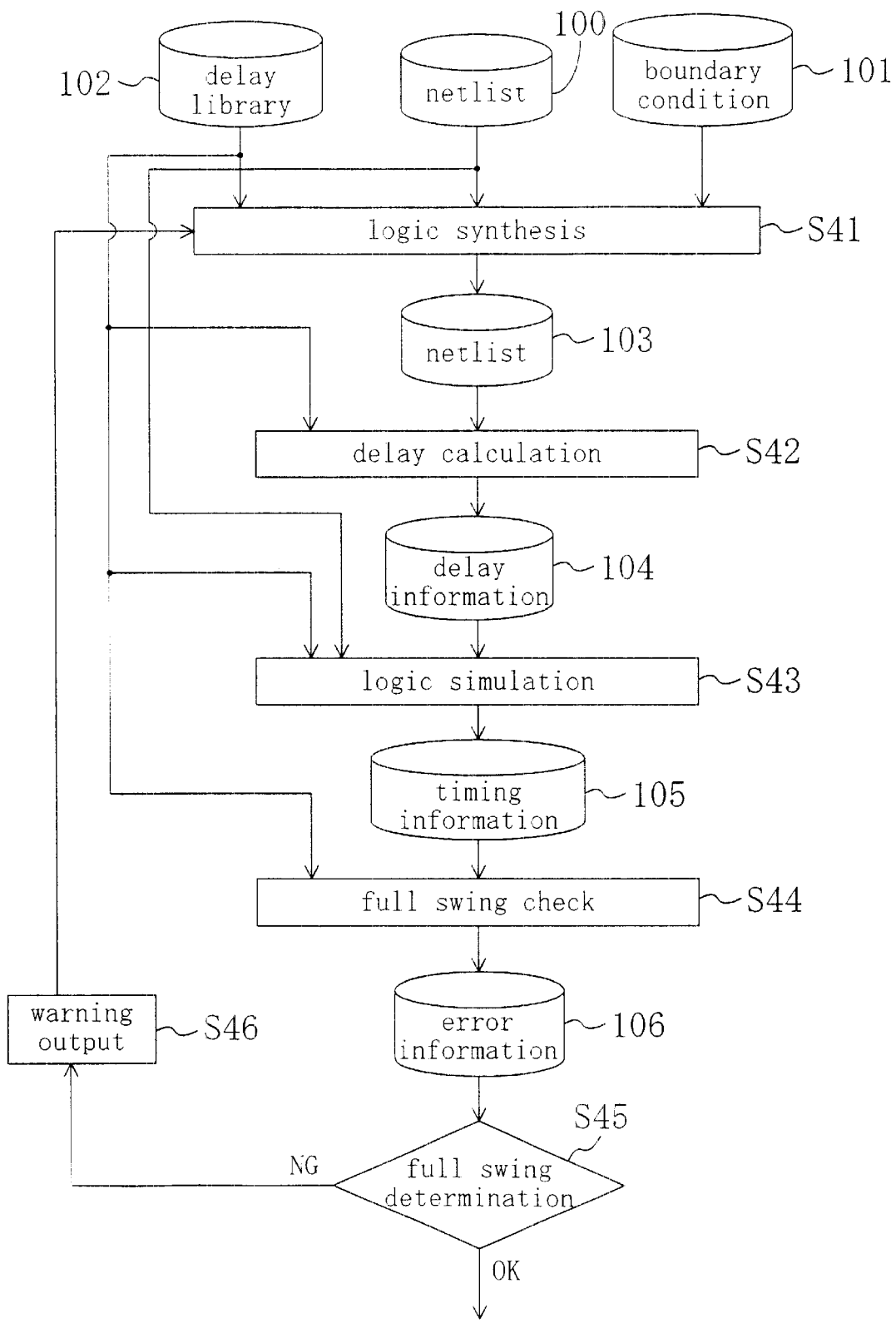
FIG. 12 is a flowchart showing a method of timing calculation and full swing determination, using the delay library shown in FIG. 11.

FIG. 12 is a flowchart showing the method of timing calculation and full swing determination using the delay library 67 generated as described above.

First, at Step S41, a logic synthesis is performed by using a netlist 10 like an edif or verilog netlist, aboundary condition 101 and a delay library 102 so as to generate a netlist 103. The delay library 102 is assumed to be the delay library 67 shown in FIG. 11.

At Step S42, a delay calculation is performed by using the netlist 103 and the delay library 102 to obtain delay information 104. It must be noted that the delay calculation is performed on the assumption that the signal waveforms at all the cell output terminals in the circuit make a full swing.

At Step S43, a logic simulation is performed by using the delay information 104, the delay library 102 and the netlist 100 so as to generate timing information 105. At Step S44, all the cells that have not made a full swing in the circuit are extracted from the timing information 105 and the delay library 102 by performing a full swing check so as to output them as error information 106.

With reference to FIG. 13, the full swing check S44 will be described in detail as follows. Concerning the cell 110, it is assumed that the delay library 102 shown in FIG. 13 is generated and that the timing information 105 shown in FIG. 13 is generated at Step S43.

In association with the input signal waveforms slews t1, t2 and t3 and the load capacitance c1, c2 and c3, the delay library 102 stores cell delays d-r-t1c1, d-r-t1c2, ..., d-r-t3c2 and d-r-t3c3 in the case where the output signal waveform is rising; cell delays d-f-t1c1, d-f-t1c2, ..., d-f-t3c2 and d-f-t3c3 in the case where the output signal wave form is falling; first full swing check values fc1-r-t1t1c1, fc1-r-t1t1c2, ..., fc1-r-t3t3c2 and fc1-r-t3t3c3 in the case where the terminal A receives a falling signal and a rising signal in this order; first full swing check values fc1-f-t1t1c1, fc1-f-t1t1c2, ..., fc1-f-t3t3c2 and fc1-f-t3t3c3 in the case where the terminal A receives a rising signal and a falling signal in this order; and second full swing check values fc2-t1t1c1, fc2-t1t1c2, ..., fc2-t3t3c2 and fc2-t3t3c3. The library 102 further stores similar information concerning the terminal B.

The first full swing check values fc1-r-tAtBcC, fc1-f-tAtBcC and the second full swing check value fc2-tAtBcC are the values when the first-entered signal (the signal entered at the terminal A in FIG. 13) has a slew of tA (A=1, 2, 3), the second-entered signal (the signal entered at the terminal B in FIG. 13) has a slew of tB (B=1, 2, 3) and the cell 110 has load capacitance of cC (C=1, 2, 3). In order to simplify the explanation, each value will be given as follows.

(t1, t2, t3)=(0.5, 1.0, 3.0) [ns]
(c1, c2, c3)=(10, 20, 30) [fF]
(fc1-r-t1 t1 c1, fc1-r-t1t1c2, fc1-r-t1t1c3)=(1.0, 1.1, 1.2)
(fc1-r-t2t1c1, fc1-r-t2t1c2, fc1-r-t2 t1c3)=(1.3, 1.4, 1.5)
(fc1-r-t3 t1c1, fc1-r-t3t1c2, fc1-r-t3t1c3)=(1.6, 1.7, 1.8)
(fc1-r-t1t2c1, fc1-r-t1t2c2, fc1-r-t1t2c3)=(1.0, 1.1, 1.2)
(fc1-r-t2t2c1, fc1-r-t2t2c2, fc1-r-t2t2c3)=(1.3, 1.4, 1.5)
(fc1-r-t3t2c1, fc1-r-t3t2c2, fc1-r-t3t2c3)=(1.6, 1.7, 1.8)
(fc1-r-t1t3c1, fc1-r-t1t3c2, fc1-r-t1t3c3)=(1.0, 1.1, 1.2)
(fc1-r-t2t3c1, fc1-r-t2t3c2, fc1-r-t2t3c3)=(1.3, 1.4, 1.5)
(fc1-r-t3t3c1, fc1-r-t3t3c2, fc1-r-t3t3c3)=(1.6, 1.7, 1.8)
(fc1-f-t1t1c1, fc1-f-t1t1c2, fc1-f-t1t1c3)=(1.0, 1.1, 1.2)
(fc1-f-t2t1c1, fc1-f-t2t1c2, fc1-f-t2t1c3)=(1.3, 1.4, 1.5)
(fc1-f-t3 t1 c1, fc1-f-t3 t1c2, fc1-f-t3 t1c3)=(1.6, 1.7, 1.8)
(fc1-f-t1t2c1, fc1-f-t1t2c2, fc1-f-t1t2c3)=(1.0, 1.1, 1.2)
(fc1-f-t2t2c1, fc1-f-t2t2c2, fc1-f-t2t2c3)=(1.3, 1.4, 1.5)
(fc1-f-t3t2c1, fc1-f-t3t2c2, fc1-f-t3t2c3)=(1.6, 1.7, 1.8)
(fc1-f-t1t3 c1, fc1-f-t1t3c2, fc1-f-t1t3c3)=(1.0, 1.1, 1.2)
(fc1-f-t2t3 c1, fc1-f-t2t3c2, fc1-f-t2t3c3)=(1.3, 1.4, 1.5)
(fc1-f-t3t3 c1, fc1-f-t3t3c2, fc1-f-t3t3c3)=(1.6, 1.7, 1.8)
(fc2-t1 t1 c1, fc2-t1 t1c2, fc2-t1 t1c3)=(1.0, 1.1, 1.2)
(fc2-t2 t1 c1, fc2-t2 t1c2, fc2-t2 t1c3)=(1.3, 1.4, 1.5)
(fc2-t3 t1 c1, fc2-t3 t1c2, fc2-t3 t1c3)=(1.6, 1.7, 1.8)
(fc2-t1t2c1, fc2-t1t2c2, fc2-t1t2 c3)=(1.0, 1.1, 1.2)
(fc2-t2t2c1, fc2-t2t2c2, fc2-t2t2c3)=(1.3., 1.4, 1.5)
(fc2-t3t2c1, fc2-t3t2c2, fc2-t3t2c3)=(1.6, 1.7, 1.8)
(fc2-t1t3 c1, fc2-t1t3c2, fc2-t1t3c3)=(1.0, 1.1, 1.2)
(fc2-t2t3 c1, fc2-t2t3c2, fc2-t2t3c3)=(1.3, 1.4, 1.5)
(fc2-t3t3 c1, fc2-t3t3c2, fc2-t3t3c3)=(1.6, 1.7, 1.8)

On the other hand, the timing information 105 includes the time of signals entered at the input terminals A and B of the cell 110 and the slew and type (rise or fall) of each edge. FIG. 13 shows that when the test vector is entered at the circuit at the time 0, the input terminal A receives a rising signal having a slew of 1.0 ns at the time 16.0 ns, and a falling signal having a slew of 0.5 ns at the time 25.0 ns, while the input terminal B receives a falling signal having a slew of 0.5 ns at the time 17.0 ns and a rising signal having a slew of 1.0 ns at the time 26.0 ns.

The timing information 105 shown in FIG. 13 indicates that it is necessary to check whether the signal waveforms make a full swing or not at the input terminals A and B between the time 16.0 ns and the time 17.0 ns. In contrast, between the time 25.0 ns and the time 26.0 ns, it is unnecessary to check whether they make a full swing or not. The reason for this is that since the cell 110 is an AND gate, the output terminal Y remains at the VSS even if any signal is entered at the input terminal B after the time 25.0 ns when the input signal of the input terminal A falls.

The full swing check between the time 16.0 ns and the time 17.0 ns will be described in detail as follows. It is assumed that the load capacitance connected to the input terminal Y is 20 fF and the threshold voltage is (VDD/2).

The signal entered at the input terminal A begins to rise from the VSS at the time 16.0 ns, and reaches the VDD at the time 17.0 ns. The signal passes through the threshold voltage at the time 16.5 ns. The signal entered at the input terminal B, on the other hand, begins to fall from the VDD at the time 17.0 ns and reaches the VSS at the time 17.5 ns. The signal passes through the threshold voltage at 17.25 ns. In this case, these signals entered at the input terminals A and B shape linear ramp waveforms. When the logic simulator can deal with the signal waveform as a nonlinear signal waveform, the time when each input signal passes through the threshold voltage is also outputted from the logic simulator.

Consequently, the timing difference between the signal waveforms at the input terminals A and B becomes 0.75

(=17.25−16.5) ns. On the other hand, the second full swing check value fc2-t2t1c2 in this case is 1.4 ns. Since the value of the timing difference is smaller than the second full swing check value, it is determined that the output signal waveform of the cell 110 does not make a full swing in this case. On the contrary, when the timing difference between the signal waveforms at the input terminals A and B is larger than the second full swing check value 1.4 ns, the output signal waveform of the cell 110 is determined to make a full swing.

Since the input terminal A receives a rising signal at the time 16.0 ns and a falling signal at the time 25.0 ns, and the slews of these signals are 1.0 ns and 0.5 ns, respectively, the time interval between the rising signal and the falling signal becomes (25+(0.5/2))−(16.0+(1.0/2))=14.75 ns. This value is checked by using the first full swing check value fc1-f-t2t1c2. The time interval 14.75 ns between the rising signal and the falling signal is sufficiently larger than the first full swing check value fc1-f-t2t1c2, which is 1.4 ns. As a result, it is determined that there is no problem with the first full swing check.

As described hereinbefore, the reference of the timing information 105 generated by the logic simulation at Step S43 and the delay library 102 to each cell in the circuit makes it possible to designate the point (the output terminal of the cell) within the circuit which does not make a full swing. The information of the designated point is generated as the error information 106.

In the above description, the values of the signal waveform slew and the load capacitance are made equal to the values registered with the delay library 102; however, other values which are not registered can be interpolated by using an interpolation algorithm like a bilinear method to perform a full swing check in the same manner.

The application of the above-mentioned method to an LSI design allows LSI designers to designate the point which does not make a full swing by a static analyzing method, without using dynamic analyzing means like a circuit simulator, and also to accelerate the time required for analyzing the full swing.

At Step S45, it is determined whether there is a point which does not make a full swing, based on the error information 106. When there is such a point, a caution is issued at Step S46 to return to Step S41. At Step S41, the logic synthesis is performed again.

Figure 14A:
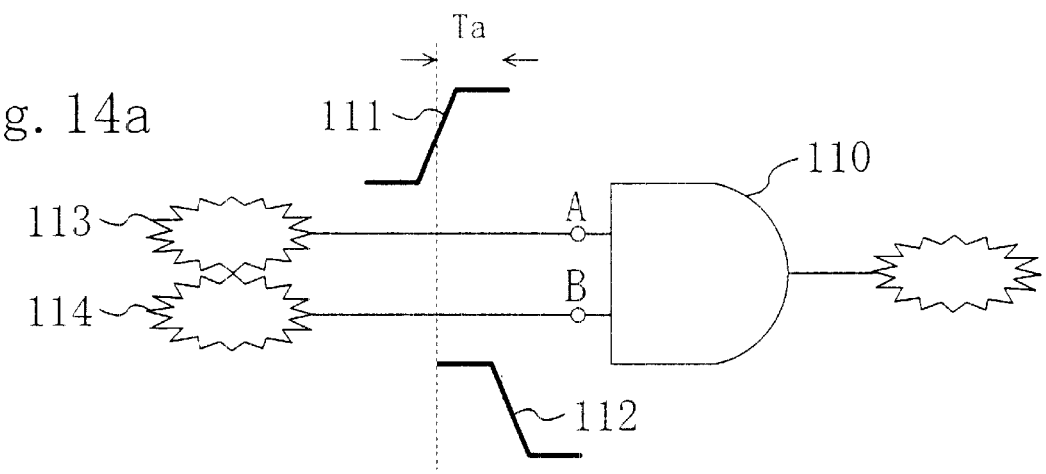
FIGS. 14(a) to 14(c) are diagrams for explaining logic resynthesis in the flowchart shown in FIG. 12.
Figure 14B:
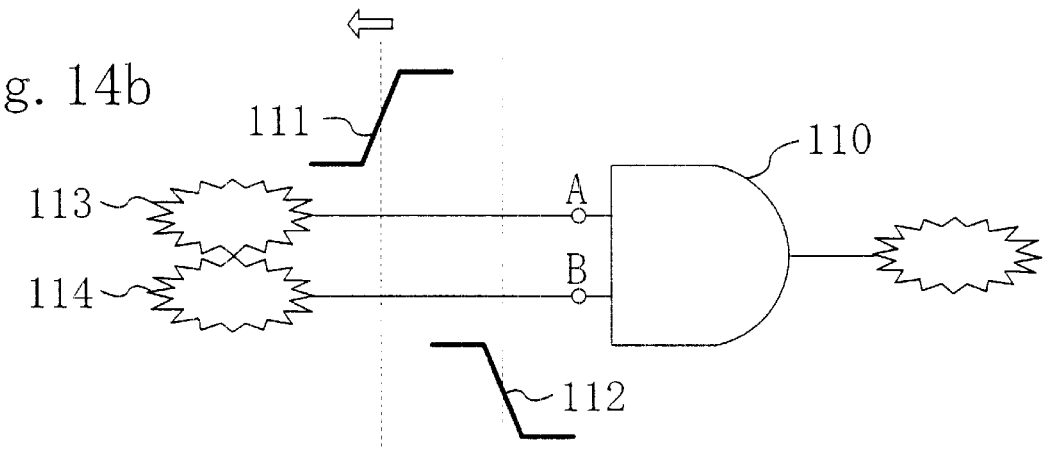
Figure 14C:
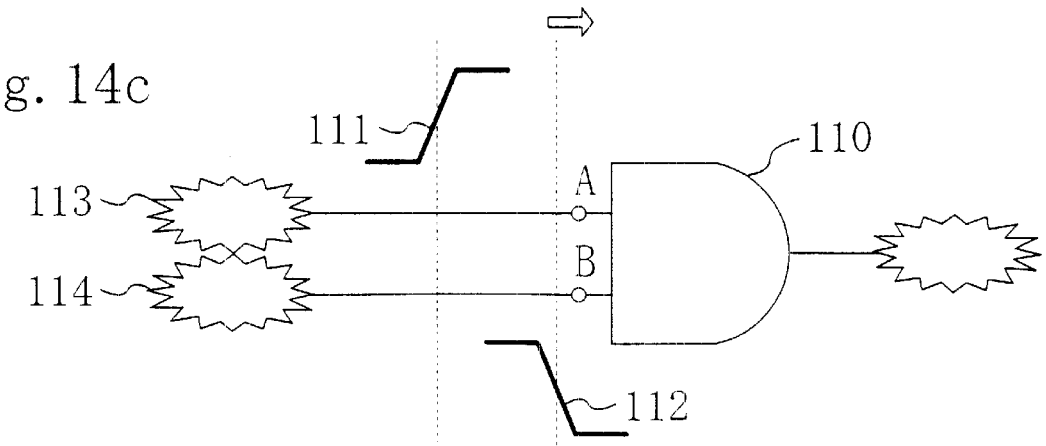
Figure 16:
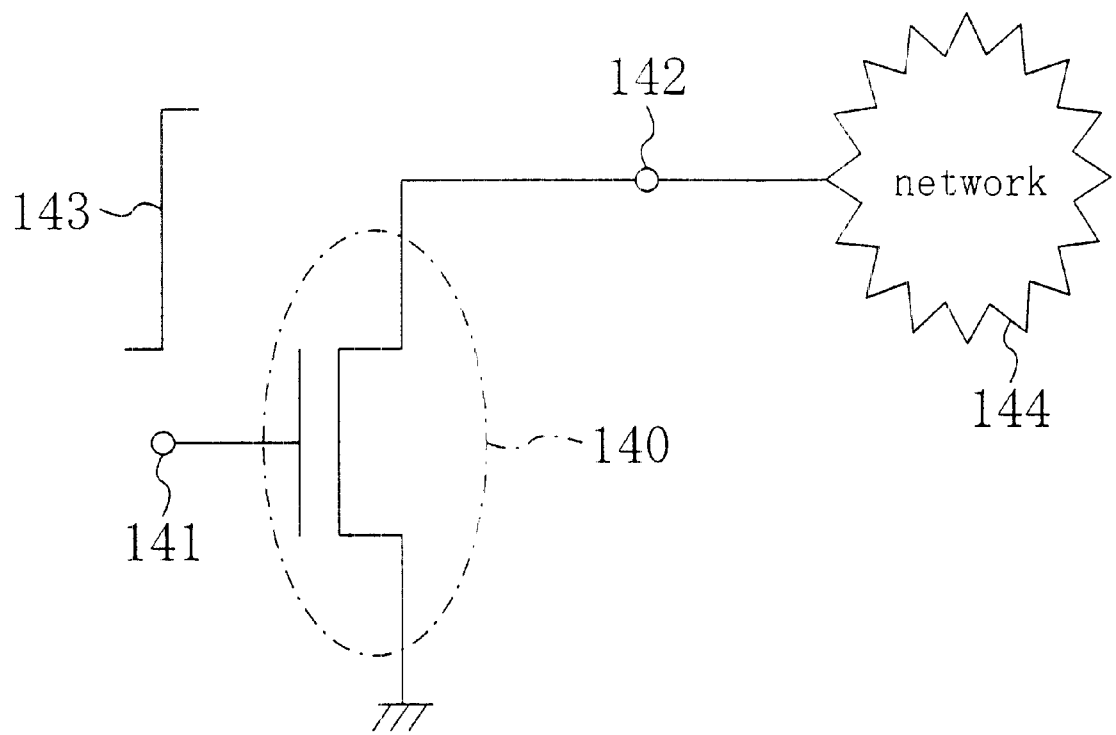
FIG. 16 is a diagram showing the modeling of the driving ability of a cell.

With reference to FIGS. 14(a) to 14(c), a method of logic resynthesis will be described as follows.

In FIG. 14(a), when the output terminal of the cell 110 is determined not to make a full swing, the timing difference Ta between the input signal 111 at the input terminal A and the input signal 112 at the input terminal B is smaller than the second full swing check value. In order to avoid an error in the cell 110, the circuit can be modified to make the timing difference Ta between the input signal 111 of the input terminal A and the input signal 112 of the input terminal B larger than the second full swing check value.

One such method is, as shown in FIG. 14(b), to reduce the delay time in the first network 113 connected to the input terminal A so as to move the time when the input signal 111 is entered ahead. Alternatively, as shown in FIG. 14(c), it is possible to increase the delay time in the second network 114 connected to the input terminal B so as to delay the time when the input signal 112 is entered. Such optimization of a circuit realizes a circuit configuration with no full swing.

Although the above description shows the case of a two-input AND gate, multi-input logic cells can go through the full swing check by the same procedure.

Thus, it is possible to perform a full swing check of a circuit based on the timing information, and to correct errors based on the error information which indicates whether a signal waveform makes a full swing or not. Moreover, the logic synthesis step can be a layout step to perform a full swing check using more detailed information.

Although the above description shows the method for checking the second full swing check value, the first full swing check value can be checked in the same manner.

As described hereinbefore, the adoption of the concept of the first and second full swing check values to a delay library makes it possible to determine whether the output signal waveforms of all the cells in a designed circuit make a full swing or not, and to avoid a decrease in time to calculate the cell delay caused by not making a full swing.

In conclusion, according to the present invention, the adoption of the concept of the full swing check values to a delay library allows the determination of whether the output signal waveforms of all the cells in a designed circuit make a full swing or not, and to avoid a decrease in time to calculate the cell delay caused by not making a full swing.

What is claimed is:

1. A method for representing a delay library used for delay calculation of a cell, said method including the steps of:

entering as an input signal to said cell, a signal having a first edge and a step waveform which lags the first edge by a fixed time interval, and a signal having a step waveform and a second edge which lags the step waveform by said fixed time interval, and representing a driving ability of said cell either by a function or in a table having as parameters a slew of the first edge, a slew of the second edge, said fixed time interval and load capacitance driven by said cell.

2. A method for generating a delay library used for delay calculation of a cell, comprising:

a first step of finding output signal waveforms of said cell, based on combinations of input signal waveforms and output load capacitances;

a second step of determining whether each of the output signal waveforms found in the first step makes a full swing or not;

a third step of generating a first delay library from the combinations of the input signal waveforms and output load capacitances concerned with the output signal waveforms that have been determined to make a full swing in the second step;

a fourth step of generating a second delay library from the combinations of the input signal waveforms and output load capacitances concerned with the output signal waveforms that have been determined not to make a full swing in the second step; and a fifth step of generating a delay library of said cell by synthesizing the first delay library and the second delay library.

3. A method for calculating a delay time of a cell, comprising:

a first step of dividing an input signal waveform having a first edge and a second edge which lags the first edge by a fixed time interval into a first division waveform having the first edge and a step waveform which lags the first edge by said fixed time interval, and a second division waveform having a step waveform and the second edge which lags the step waveform by said fixed time interval, by using a delay library a second step of finding, with reference to said delay library, a first output signal waveform which is an output signal waveform shaped when the first division waveform is entered at said cell and a second output signal waveform which is an output signal waveform shaped when the second division waveform is entered at said cell; and a third step of finding an output signal waveform of said cell by synthesizing the first output signal waveform and the second output signal waveform, said delay time of said cell being calculated based on the input signal waveform, and the output signal waveform found in the third step, said delay library generated by a method which includes the steps of:

entering as an input signal to said cell, a signal having a first edge and a step waveform which lags the first edge by a fixed time interval, and a signal having a step waveform and a second edge which lags the step waveform by said fixed time interval, and representing a driving ability of said cell either by a function or in a table having as parameters a slew of the first edge, a slew of the second edge, said fixed time interval and load capacitance driven by said cell.

4. A method for representing a delay library used for delay calculation of a cell, said method including the steps of:

entering as an input signal to said cell, a signal having a first edge and a second edge which lags the first edge by a fixed time interval, and representing a value of said fixed time interval required for an output signal waveform to make a full swing as a full swing check value when said input signal is entered at said cell either by a function or in a table having as parameters a slew of the first edge and load capacitance driven by said cell.

5. A method for generating a delay library used for delay calculation of a cell, comprising:

a first step of finding an output signal waveform of said cell, based on an input signal waveform having a first edge and a second edge which lags the first edge by a fixed time interval, and an output load capacitance;

a second step of determining whether the output signal waveform found in the first step makes a full swing or not; and a third step of changing a value of said fixed time interval when the output signal waveform is determined not to make a full swing in the second step, and repeating the first to third step to find the value of said fixed time interval required for the output signal waveform of said cell to make a full swing as a full swing check value, and thereby to generate said delay library by using said full swing check value.

6. A method for calculating a delay time of a cell, comprising:

a first step of dividing an input signal waveform having a first edge and a second edge which rags the first edge by a fixed time interval into a first division waveform having the first edge and a step waveform which lags the first edge by said fixed time interval, and a second division waveform having a step waveform and the second edge which lags the step waveform by said fixed time interval, by using a delay library;

a second step of finding, with reference to said delay library, a first output signal waveform which is an output signal waveform shaped when the first division waveform is entered at said cell and a second output signal waveform which is an output signal waveform shaped when the second division waveform is entered at said cell; and a third step of finding an output signal waveform of said cell by synthesizing the first output signal waveform and the second output signal waveform, said delay time of said cell being calculated based on the input signal waveform, and the output signal waveform found in the third step, said delay library generated by a method which includes:

a first step of finding output signal waveforms of said cell, based on combinations of input signal waveforms and output load capacitances;

a second step of determining whether each of the output signal waveforms found in the first step makes a full swing or not;

a third step of generating a first delay library from the combinations of the input signal waveforms and output load capacitances concerned with the output signal waveforms that have been determined to make a full swing in the second step;

a fourth step of generating a second delay library from the combinations of the input signal waveforms and output load capacitances concerned with the output signal waveforms that have been determined not to make a full swing in the second step; and a fifth step of generating a delay library of said cell by synthesizing the first delay library and the second delay library.

* * * * *

UNITED STATES PATENT AND TRADEMARK OFFICE
CERTIFICATE OF CORRECTION

PATENT NO.    : 6,629,299 B1
DATED         : September 30, 2003
INVENTOR(S)   : Nobufusa Iwanishi It is certified that error appears in the above-identified patent and that said Letters Patent is hereby corrected as shown below:

<u>Column 14,</u>
Line 63, after the word "library" insert -- ; --

<u>Column 16,</u>
Line 6, "rags" should be -- lags --

Signed and Sealed this

Twenty-second Day of June, 2004

JON W. DUDAS
*Acting Director of the United States Patent and Trademark Office*